United States Patent [19]
Brust

[11] Patent Number: 5,260,648
[45] Date of Patent: Nov. 9, 1993

[54] PROCESS AND SYSTEM FOR RAPID ANALYSIS OF THE SPECTRUM OF A SIGNAL AT ONE OR SEVERAL POINTS OF MEASURING

[76] Inventor: Hans-Detlef Brust, Martin-Luther-Str. 2, D-6602 Dudweiler, Fed. Rep. of Germany

[21] Appl. No.: 646,785
[22] PCT Filed: May 28, 1990
[86] PCT No.: PCT/DE90/00391
§ 371 Date: Jan. 29, 1991
§ 102(e) Date: Jan. 29, 1991
[87] PCT Pub. No.: WO90/15340
PCT Pub. Date: Dec. 13, 1990

[30] Foreign Application Priority Data
May 29, 1989 [DE] Fed. Rep. of Germany ....... 3917411

[51] Int. Cl.⁵ .................. G01R 31/28; G01R 31/305
[52] U.S. Cl. ............................. 324/158 R; 324/96; 324/76.26; 324/76.41; 250/310; 250/311
[58] Field of Search .............. 250/310, 311; 324/158 R, 77 C, 79 R, 96

[56] References Cited

U.S. PATENT DOCUMENTS

| | | | |
|---|---|---|---|
| 3,643,126 | 2/1972 | Hay | 324/77 C |
| 3,660,763 | 5/1972 | Parzen | 324/79 R |
| 4,220,853 | 9/1980 | Feurbaum | 250/310 |
| 4,223,220 | 9/1980 | Feurbaum | 250/310 |
| 4,244,054 | 1/1981 | Lorea | 324/77 C |
| 4,451,782 | 5/1984 | Ashida | 324/77 C |
| 4,728,884 | 3/1988 | Gumm | 324/79 R |
| 4,745,362 | 5/1988 | Brust | 324/158 R |
| 4,820,977 | 4/1989 | Brust | 324/158 R |
| 4,831,328 | 5/1989 | Brust | 250/310 |
| 4,853,622 | 8/1989 | Brust | 324/158 R |
| 4,954,773 | 9/1990 | Brust | 324/158 R |
| 4,972,142 | 11/1990 | Brust | 324/158 R |

OTHER PUBLICATIONS

Nakamae et al.: "Accurate Measurement Of The Operating Frequency In IC's With The Sem" Journal of Physics & Scientific Instr.—vol. 21, 1988—pp. 913-915.
"Electron-Beam testing of VLSI chips gets practical'"—Electronics—vol. 59, No. 12, Mar. 1986—pp. 51-54.

*Primary Examiner*—Kenneth A. Wieder
*Assistant Examiner*—Jose M. Solis
*Attorney, Agent, or Firm*—Evenson, McKeown, Edwards & Lenahan

[57] ABSTRACT

In electron beam measuring, it is often also necessary to measure the frequency range in addition to the measuring time range. In order to do this, according to the invented process, the output signal of the local oscillator of a spectrum analyzer, as is known from conventional high-frequency measuring, undergoes a first frequency conversion and subsequently is utilized for modulating the primary beam. Based on the potential contrast as a multiplicative interaction and the modulated primary beam, the under circumstances very high-frequency signal to be analyzed is transformed to an easily detected low intermediate frequency. Subsequently this intermediate frequency signal is transferred into an input frequency plane of the spectrum analyzer by a second frequency conversion. Both the variable input selection frequency or the fixed intermediate frequency of the spectrum analyzer may be the frequency. The measured result appears in the usual manner on the display of the spectrum analyzer.

20 Claims, 5 Drawing Sheets

PROCESS AND SYSTEM FOR RAPID ANALYSIS OF THE SPECTRUM OF A SIGNAL AT ONE OR SEVERAL POINTS OF MEASURING

BACKGROUND AND SUMMARY OF THE INVENTION

The present invention relates to a method and apparatus for performing a rapid analysis of the spectrum of a signal at one or several points of measurement, and for determining the spatial distribution of individual spectral lines.

Analysis of the mode of function of high-integrated circuits is usually performed in computer-controlled test systems, in which errors can be identified by analyzing the voltage level detected at the outputs of the examined circuit dependent on the respectively fed bit pattern; however, such measurement points can be located only with great difficulty. For this reason, additional measuring must be conducted inside high-integrated circuits, particularly during the development phase.

Particle beam measuring processes, especially electron beam measuring, used in all fields of development and fabrication of micro-electronic components, have proven particularly well suited for this purpose. With the aid of these measuring techniques, for example, the electric potential distribution in integrated circuits can be imaged ("voltage coding" and "logic state mapping") or the temporal potential course can be determined at a single point of junction (wave-form measuring). A survey of the test procedures currently generally employed is given in the publications "Electron Beam Testing" by E. Wolfgang ("Microelectronic Engineering", issue 4, 1986, pages 77-106) and "Electron Beam Testing" by K. Ura and H. Fujicka ("Advances in Electronics and Electron Physics", volume 73, 1989, pages 233 -317).

An important object of these processes is to determine whether or not a signal of a specific frequency is at a particular conductor channel, and what the frequency spectrum of the signal is. Another object is to discover which conductor channels carry a specific signal (and therewith a specific signal frequency). The frequency tracing and frequency mapping processes, which were developed for this purpose are described in detail in the publication "Frequency Tracing and Mapping in Theory and Praxis" by H. D. Burst and F. Fox ("Microelectronic Engineering" volume 2, 1984, pages 299-323). These processes are especially useful in examining asynchronous circuits, for which other processes based on sampling techniques are unsuccessful due to insufficient synchronization.

Unfortunately, in prior art frequency range methods of frequency tracing and mapping, a spectrum analysis can be conducted only quite slowly for reasons which will be explained later, and previous proposals to accelerate the process based on the principle of velocity modulation (described in German patent applications 454 and DE 35 10 525) are relatively complicated and expensive. Moreover, conducting measuring of this type differs considerably from conventional measuring in the field of high-frequency technology, which presents problems to a user who is not particularly familiar with electron beam testing.

The object of the present invention is to provide a simple, low cost method and apparatus for rapidly analyzing a spectrum of a signal and representing the spatial distribution of the spectral lines.

This object is achieved by a process and apparatus in accordance with the present invention in which the sample circuit is irradiated by a primary beam which interacts with the sample in a manner dependent on the quantity to be analyzed, and a secondary signal is derived which is indicative of said interaction. The output signal of the local oscillator of a spectrum analyzer, after undergoing a frequency conversion, is used to modulate the primary beam. The frequency to be analyzed, as contained in the secondary signal, is transformed to an easily detected low intermediate frequency, and transferred into an input frequency range of the spectrum analyzer. The measured result is displayed on an output CRT of the spectrum analyzer.

A principal advantage of the present invention lies in its ability to facilitate rapid measurement, which is less taxing on the sample to be examined. In contrast to prior art processes, rapid examination also permits continuous monitoring of a signal at a measuring point. Moreover, the measuring process and the collateral system are the same as in conventional high-frequency measuring, although the interpretation of the results differ somewhat. In this way, the user requires no training time.

Other objects, advantages and novel features of the present invention will become apparent from the following detailed description of the invention when considered in conjunction with the accompanying drawings.

BRIEF DESCRIPTION OF THE DRAWINGS

The same designations in the figures identify the same signals and the same parts of the circuit throughout the drawing.

DETAILED DESCRIPTION OF THE DRAWINGS

Although the following preferred embodiments refer to an electron beam measuring device, the present invention is to be understood in such a manner that ions or other particles may be utilized instead of electrons, both as primary particles and secondary particles. Just as radiation, such as laser or X-ray radiation, may also be used instead of primary, respectively secondary particles.

Figure 1:
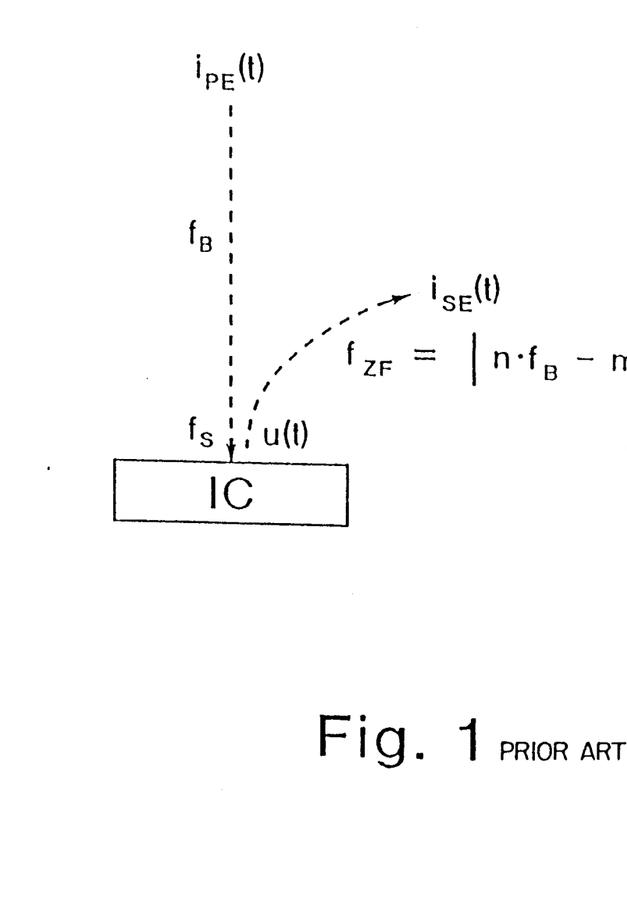
FIG. 1 depicts the fundamental principle of the frequency range methods.

As illustrated in FIG. 1, in the electron beam measuring processes, a finely focused primary electron beam is directed at the measuring point of the integrated circuit to be examined. The primary electrons impinging thereupon release secondary electrons from the surface of the sample, which are influenced by the electric potential of the surface of the sample. This influence manifests itself in a secondary electron stream which is dependent on the potential, and in an energy shift of the secondary electrons which also is determined by the electric potential at the measuring point and can be measured with the aid of an energy spectrometer. This effect is called a potential contrast.

In principle, it should suffice to impinge primary electrons upon the measuring point, to register the corresponding secondary electron stream and to guide the secondary electron signal to a conventional spectrum analyzer for spectrum analysis. Indeed, this can be done, but only, however, if the signals to be examined have relatively low frequencies, because the detectors required for registering the secondary electrons usually only have a relatively small bandwidth of several MHz. Therefore, a scanning process is utilized in which a triggering signal causes the temporal course of the signal to be scanned at the measuring point with short electron pulses in the same manner as with a sampling oscilloscope. In this manner, high time resolution can be achieved, even with time range processes.

In frequency range processes, "frequency tracing" and "frequency mapping", a different technique is employed in order to overcome this difficulty. The signal frequency to be examined which is usually quite high, is mixed down to a low intermediate frequency, which the secondary electron detector can easily transmit, before the detector limiting the bandwidth. The potential contrast is utilized as nonlinear interaction for this mixing process. FIG. 1 depicts this principle. The potential contrast ensures that the secondary electron stream $i_{SE}$ is proportional to the primary electron stream $i_{PE}$, and that it is dependent on the signal u(t) at the measuring point. Thus, the relationship $$i_{SE(t)} = i_{PE}(t) * g(u(t)) \quad (1)$$

holds true, with g standing for the characteristic of the potential contrast, that is the relationship between the signal u(t) at the measuring point and its influence on the secondary electron stream $i_{SE}$. In the first approximation this characteristic is considered linear, and thus the relationship (1) is treated as purely multiplicative. If the signal u(t) has a signal frequency $f_S$ in its spectrum, this signal frequency can be mixed down to the low intermediate frequency $f_{ZF}$ by modulating the primary electron beam PE and thereby the primary electron stream $i_{PE}(t)$ with a frequency of $f_B$, which is minimally offset, namely by $f_{ZF}$, against the signal frequency $f_S$ to be measured. Precisely said, the mixing condition $$|n f_B - m f_S| = f_{ZF} \quad (2)$$

has to be met. The following reflections are based on a fundamental wave mixing, thus n=m=1, without the intention of limiting the scope or spirit of the present invention. Harmonic wave mixing ensues analogously, only that in the subsequent relationships $f_b$ has to be replaced by $nf_a$, respectively $f_a$ by $mf_S$.

Figure 2:
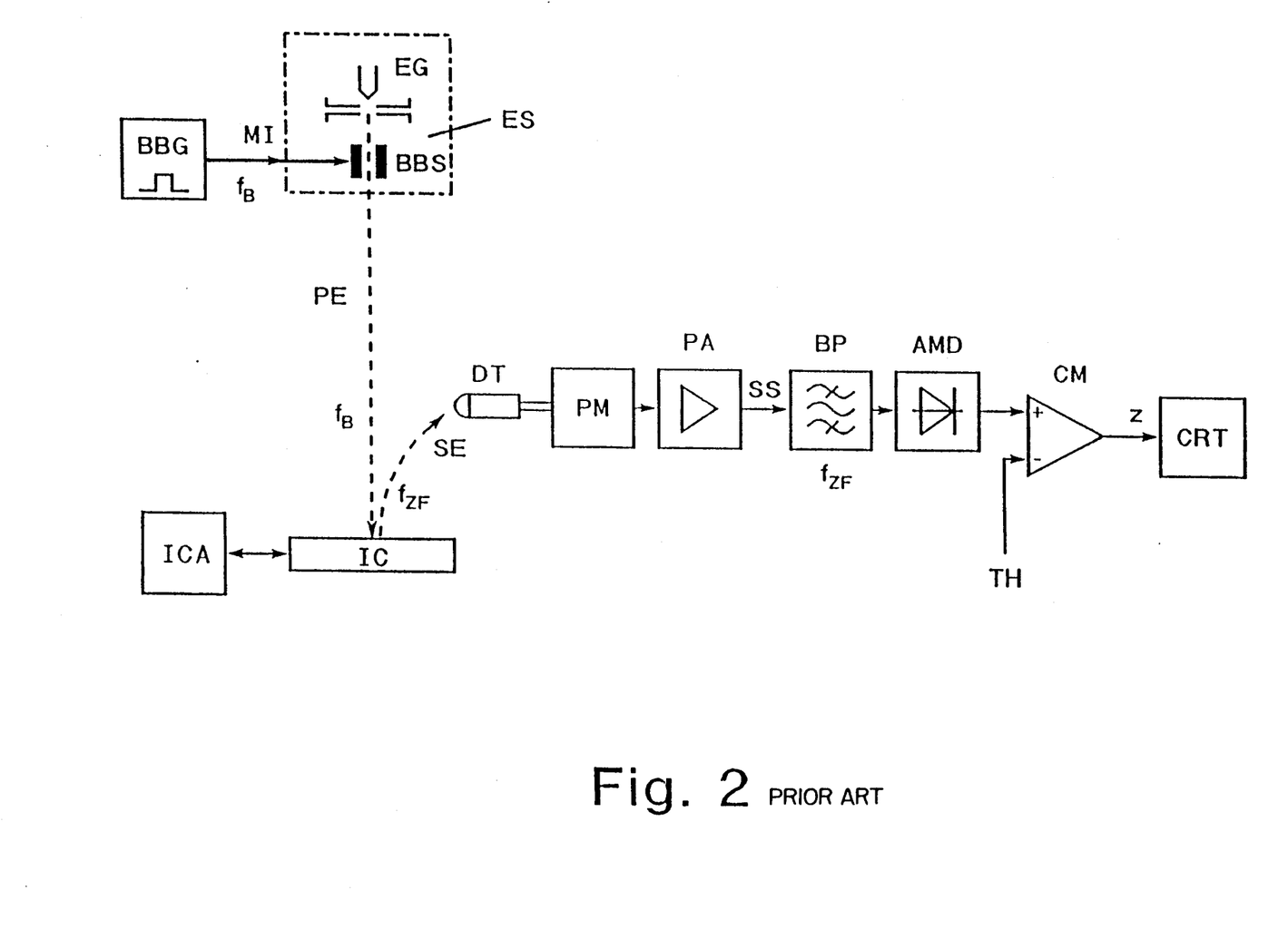
FIG. 2 depicts a system for conducting the conventional frequency tracing process.

FIG. 2 shows how this fundamental principle is realized in frequency tracing processes. The spatial distribution of individual spectral lines can be determined by frequency tracing processes, i.e., all the measuring points displaying a signal of a specific frequency in the signal spectrum, are imaged. FIG. 2 depicts schematically a system, with which the frequency tracing process can be realized. The principal feature of this system, as well as of the system described hereinafter, is, by way of illustration, an electron beam measuring device such as is disclosed in U.S. Pat. Nos. 4,220,853 and 4,223,220, and a raster electron microscope. A finely focused primary electron beam PE is generated in the electron-optical column of such an electron beam measuring device. In addition to a multiplicity of shutters and electric or magnetic lens systems for beam shaping, beam deflection and beam focusing, which are not depicted in the subsequent figures for reasons of clarity, this electron-optical column is provided with an electron source ES, which generates the primary beam PE.

The function of the electron source ES is to generate the primary electron beam modulated with a frequency of fB. In FIG. 2, it is essentially composed of an electron gun EG consisting of a cathode, which generates the primary electrons by thermal emission, and anode and Wehneltelectrode, and a beam modulating or scanning system BBS. The continuous stream of primary electrons supplied by the cathode is modulated in its intensity with the aid of the beam modulation system BBS. In this way, a primary electron stream having a frequency of $f_b$ can be generated. Possible embodiments of th electron gun EG and beam modulation system BBS are, by way of illustration, described in the publication "Electron beam chopping systems in the SEM" by E. Menzel and E. Kubalek (Scanning Electron Microscopy, SEM Inc., AMF O'Hare, 1979/I, pages 305-317). A well suited beam modulation system is, by way of illustration, disclosed in U.S. Pat. No. 4,169,229.

In order to generate the modulated primary electron stream, a beam modulation generator BBG is connected to the modulation input MI of the electron source ES. The beam modulation generator BBG triggers the beam modulation system BBS with a modulation signal MS. In this embodiment, the modulation signal MS is composed of square pulses occurring with a constant recurrence frequency of $f_B$. Other possible ways of triggering the beam modulation system with signals of various shape are also described in the cited publication by E. Menzel and E. Kubalek and can, in principle, also be utilized. Every square pulse of the modulation signal MS keys the primary electron beam BE and generates a primary electron pulse in this manner. The width of the square pulse determines the duration of the primary electron pulse. In contrast to the time range methods, the beam modulation generator BBS is not synchronized with the rest of the measuring system.

The primary electron pulses generated in this manner are focused by the lens system (not shown) onto the sample IC, such as an integrated circuit. There the impinging primary electrons PE release secondary electrons SE, which are registered by detector DT, and are converted into light pulses. These light pulses are then guided via a light guide to the photomultiplier PM usually located outside the sample chamber of the electron beam measuring device, which turns the light pulses into an electric signal for further evaluation as a secondary (in this case electric) signal SS, if necessary following further amplification in a pre-amplifier PA connected after the photomultiplier PM.

For the reproduction of processes of interest, e.q., an error, the sample IC to be examined is operated cyclically. Therefore, the sample IC is supplied with voltages and, if need be, input signals for stimulation by a triggering means ICA. In particular, a function tester may serve as the triggering means ICA.

If the signal frequency $f_S$ occurs at the measuring point, a portion of the signal appears in the secondary electron stream at the intermediate frequency of $f_{ZF}$, This portion of the signal is filtered out with the aid of a bandpass filter BP, which is fixedly synchronized with the intermediate frequency $f_{ZF}$, demodulated in an envelope modulator AMD and then fed (if need be following a comparison with a threshold value TH in a comparator CM) to the z-input of the screen CRT of the electron measuring device thus brilliance modulating the screen writing beam. Scanning the primary electron beam PE subsequently over the sample—by means of appropriately triggering the deflection coils of the electron beam measuring device—and, as is customary, also moving the writing beam of the picture tube CRT synchronously with it, results in a brilliance distribution, which corresponds to the spatial distribution of the signal frequency $f_S$, selected by the special selection of the modulation frequency $f_B$ via mixing condition (2), on the scanned area of the sample.

If the spectrum of a signal at a measuring point is to be determined, it suffices to sweep through the modulation frequency over the frequency range of interest. This occurs in the so-called frequency mapping process. A system for performing this process in shown in FIG. 3, which differs only slightly from the system of FIG. 2. In the frequency mapping arrangement of FIG. 3, the beam modulation generator BBG is a voltage controlled oscillator (VCO) supplied by a ramp generator SG with a control voltage, which determines the output frequency $f_B$. This control voltage is also applied simultaneously at the y-deflection of the writing beam of the picture tube, while the x-deflection continues to be steered by the deflection generator RG, which also moves the primary electron beam. In this process, the primary electron beam is deflected only in one direction along one line. The modulation frequency $f_B$ is swept over the frequency range of interest by the ramp-shaped control voltage. As the primary electron beam is moved at the same time, a spectrum analysis of the signals along one line of measuring points occurs in this manner. The level of the spectrum lines is shown on the screen CRT by the brilliance of the corresponding points.

In frequency tracing and frequency mapping processes, the beam modulation generator is usually a frequency synthesizer. Unfortunately, synthesizers have relatively long switching and oscillation times when switching from one frequency to the next, as is necessary in sweeping the modulation frequency so that sweeping the modulation frequency $f_B$ can occur only relatively slowly. In a certain sense, in frequency mapping processes this necessity is turned into a virtue in that a signal is analyzed not only at a single measuring point per frequency step, but at an entire series of measuring points along a line. However, the reading precision when reading the measured values from the screen of the electron beam measuring device is relatively low.

These problems are avoided by the process according to the invention, which is also based on the fundamental principle of the other frequency range methods; that is, mixing the relatively high signal frequency $f_S$ to a low intermediate frequency $f_{ZF}$, which is easy for the detector to transmit. The fundamental idea of the process is to utilize a conventional spectrum analyzer familiar to those versed in the field of high frequency measuring, such as Tektronix mode 2756 P. (The build-up and operation mode of such spectrum analyzers is familiar to those versed in the art, and described e.q., in the company journals "Measuring with a Spectrum Analyzer" of Hewlett-Packard, and "Principles of Spectrum Analysis with the Spectrum Analyzer FSA" of Rohde & Schwarz.) The spectrum analyzer is connected to an electron measuring device according to the invention. This arrangement is advantageous not only because a spectrum analyzer has internally a rapid sweep generator at its disposal, but also because the detection circuits of a spectrum analyzer are usually oscillation-optimized and thus have particularly short reaction time.

Most spectrum analyzers work according to the superimposition principle. In contrast to the frequency range methods of electron beam measuring, however, the input signal is mixed to higher internal intermediate frequency f' in order to avoid ambiguity due to image frequencies, and is limited in its bandwidth by a low-pass filter. In Tektronix model 2756 P, this first intermediate frequency lies at 2072 MHz as long as operation is in the fundamental band and only signals up to 1.8 GHz are to be analyzed. The local oscillator, which triggers input mixer of the spectrum analyzer, has to be varied in its frequency $f_{LO}$ between 2072 and 3872 MHz. This local oscillator frequency $f_{LO}$ or one of the subsequent steps of the analyzer is usually available at an output of the spectrum analyzer. This is particularly the case, if the spectrum analyzer is prepared for connection to an external mixer. In this event, a local oscillator frequency can be tapped at the output to the connection of the external mixer.

According to the invention, the local oscillator frequency $f_{LO}$ is then utilized to modulate the primary electron beam following a frequency conversion. The frequency conversion is necessary as the local oscillator frequency usually does not lie in the desired range due to the upward mixing in the spectrum analyzer. In most cases it lies much too high. If work is to be done in the fundamental band of the spectrum analyzer, the local oscillator frequency has to be reduced by the internal intermediate frequency f' minus the desired intermediate frequency $f_{ZF}$. Thus for the modulation frequency $f_B$ $$f_B = f_{LO} - f' + f_{ZF} \tag{3}$$

holds true, the value of the intermediate frequency $f_{ZF}$ being, in principle, random. It only has to be sufficiently low that it can be transmitted by the detector without difficulty, and should lie in a range in which as few as possible distorted signals and little noise occurs. In the conventionally employed secondary electron detectors, the useful frequency range for the intermediate frequency $f_{ZF}$ lies between 250 kHz and 3 MHz. Thus if a frequency conversion according to relationship (3) is carried out, the spectral portions, in particular, of the signal to be examined having the signal frequency $$f_S = f_{LO} - f'$$

and naturally also the respective image frequency $$f_x = f_{LO} - f' + 2 \cdot f_{ZF}$$

are mixed by the potential contrast in the intermediate frequency range $f_{ZF}$. If the example of the Tektronix analyzer 2756 P is the basis and an intermediate frequency $f_{ZF} = 1$ MHz is selected, the modulation frequency varies between 1 MHz and 1801 MHz when the spectrum analyzer sweeps over the fundamental band. Accordingly, during sweeping of the entire fundamental band, the spectral portions of the signal u(t) to be examined are mixed between 0 MHz and 1800 MHz, and between 2 MHz and 1802 MHZ, at the measuring point by the potential contrast in the constant intermediate frequency range at $f_{ZF}$.

Figure 3:
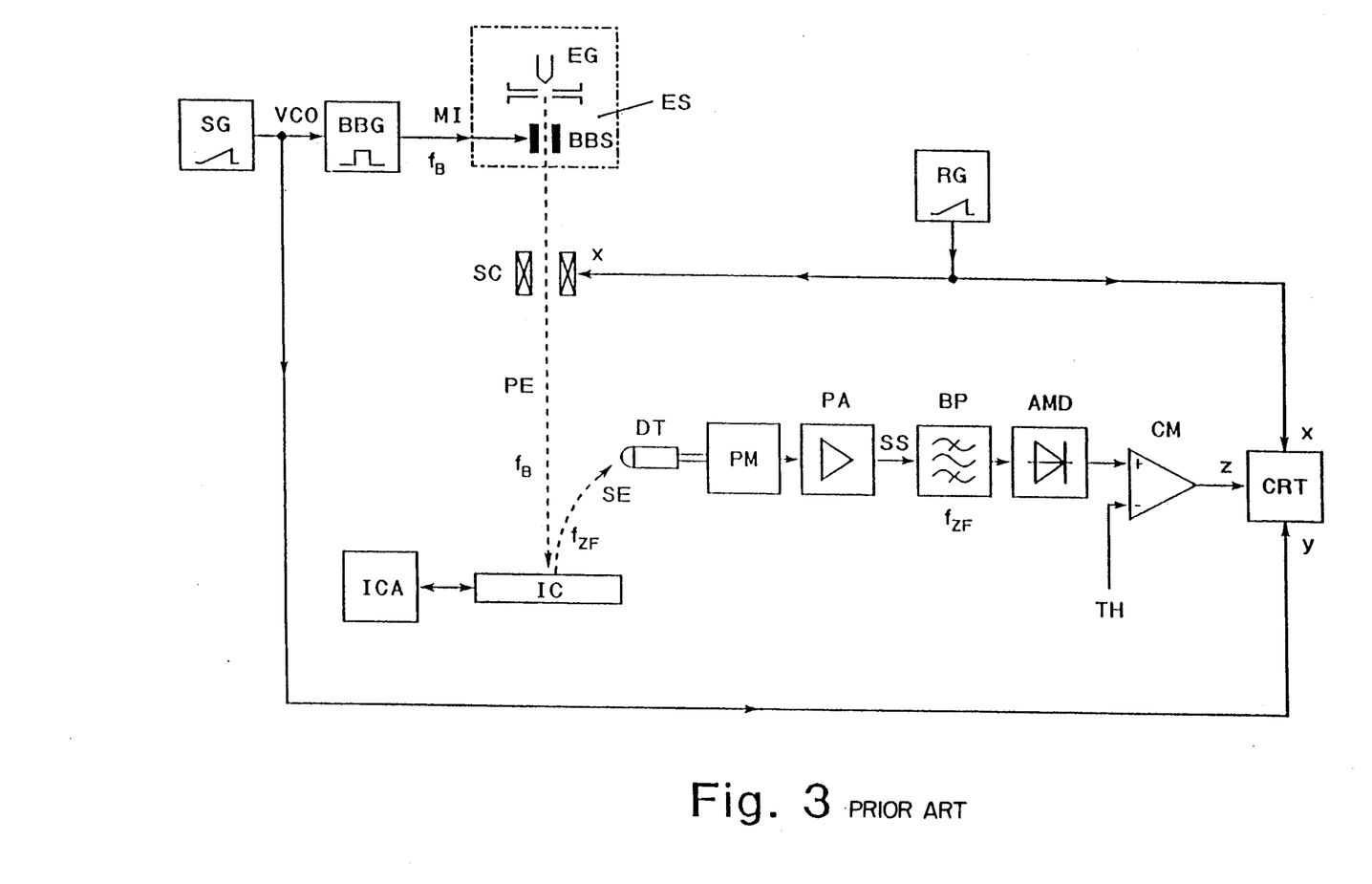
FIG. 3 depicts a system for conducting the conventional frequency mapping process.
Figure 4:
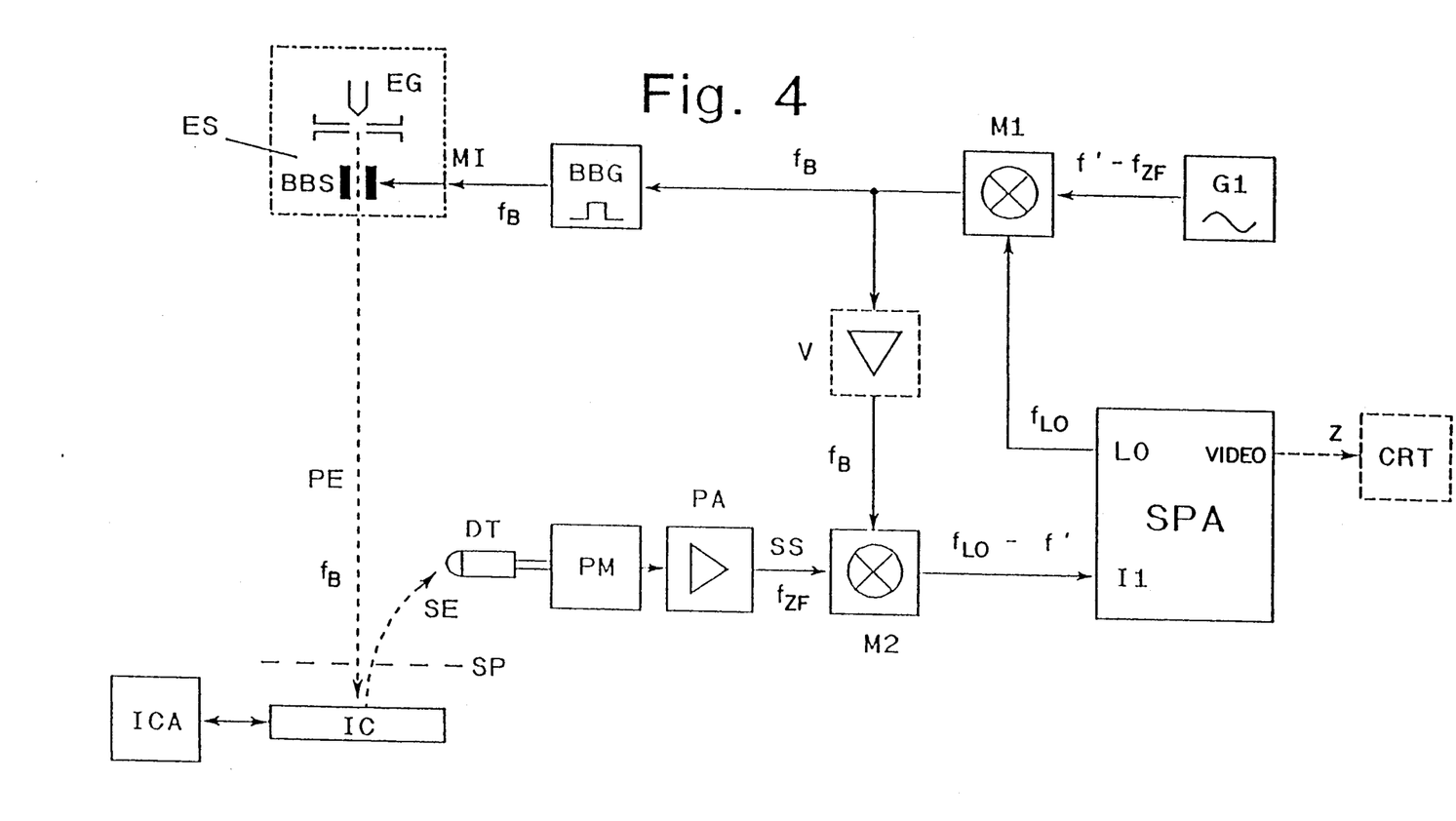
FIG. 4 depicts a system for performing the process according to the invention.

The system according to the invention is depicted in FIG. 4 wherein the sample, sample triggering, primary beam source ES and detection system DT, do not initially differ materially from the systems depicted FIGS. 2 and 3, and the description of these components, given in the systems of FIGS. 2 and 3, is also valid in the same manner for the invented process. The manner of obtaining the modulation signal, however, differs from that in the prior art processes. The output signal LO of the local oscillator of the spectrum analyzer SPA having the frequency $f_{LO}$ is transmitted to a first input of a frequency converter M1, preferably a mixer. A signal having the frequency $f'-f_{ZF}$ is transmitted to the second input of the frequency converter. In the system according to FIG. 4, this signal is generated by a first signal generator G1, which is permanently tuned to this frequency, and the output of which is connected to the second input of the frequency converter. The signal of the frequency $f'-f_{ZF}$, can also be obtained from an output frequency of the spectrum analyzer, preferably from the reference frequency, with the aid of a PLL circuit instead of with a fixedly tuned first signal generator G1. The design of PLL circuits of this type is familiar to those versed in the art.

The output signal of the frequency converter M1, having a frequency which is equal to the difference of its two input frequencies, is utilized, if need be, to modulate the primary electron beam following amplification in an amplifier connected thereafter. For this purpose, the output of frequency converter M1 is, if need be, connected via the amplifier connector therebetween, to an input of the beam modulation generator BBG, which makes a square-shaped modulation signal MS for triggering the beam modulation system BBS from the sinusoidal output signal of the frequency converter M2. To do this, the generator should be operated in the "external width mode". By way of illustration, the Hewlett-Packard Type 8080 may be employed as the beam modulation generator. However, the beam modulation system BBS can be directly triggered with the sinusoidal output signal of the frequency converter M1, and of the amplifier. In this event, the beam modulation generator BBG may be dispensed with, and replaced by a passive "bias-T" in order to superimpose a direct voltage for optimum focusing of the point of operation.

The spectral component of interest now lies after the detector DT and the pre-amplifier PA in the intermediate frequency range thus at $f_{ZF}$. In order to facilitate the actual spectrum analysis by the spectrum analyzer SPA, it is necessary to "pretend to" the spectrum analyzer that this signal component is its input signal. For this purpose, the spectral component has to be transformed from the intermediate frequency range into an input frequency range of the spectrum analyzer. The input frequency range may be the actual, variable input selection range or one of the usually fixed internal intermediate ranges of the spectrum analyzer. The required frequency transformation once again occurs with the aid of a frequency converter.

First of all, the case is described in which the spectral component is to be transformed in the input selection range. If the local oscillator has a frequency of $f_{LO}$, the signal is just being analyzed at the frequency $f_{LO}-f'$ at the input of the spectrum analyzer SPA. This is the input selection range, and as it is dependent on the local oscillator frequency $f_{LO}$, it is not constant but variable. Therefore, the frequency of the spectral component of interest must be raised from $f_{ZF}$ to $F_{LO}-f'$. To do this, in FIG. 4, the secondary signal, SS and therewith the signal component of interest, is transmitted at $f_{ZF}$ to a first input of a second frequency converter M2, which again may be a mixer. As can be seen from equation (3) above, the desired frequency transformation may occur simply by applying the modulation frequency $f_B$ to the second input of the frequency converter M2, for the sum frequency and the difference frequency of both its input signals appear at the output of a mixer, which can be utilized as the frequency converter. For this purpose, the second input of the second frequency converter M2 is connected to the output of the first frequency converter M1, if need be, via an amplifier V connected therebetween. The spectral component of interest at the output of the second frequency converter is then in the input selection range of the spectrum analyzer, so that the output of the frequency converter M2 may be simply connected to the selection input I1 of the spectrum analyzer. This relationship is maintained independent of the respective current frequency $f_{LO}$ of the local oscillator, so that the spectrum analyzer always registers the amplitude of the current spectral components of the signal to be examined.

Figure 5:
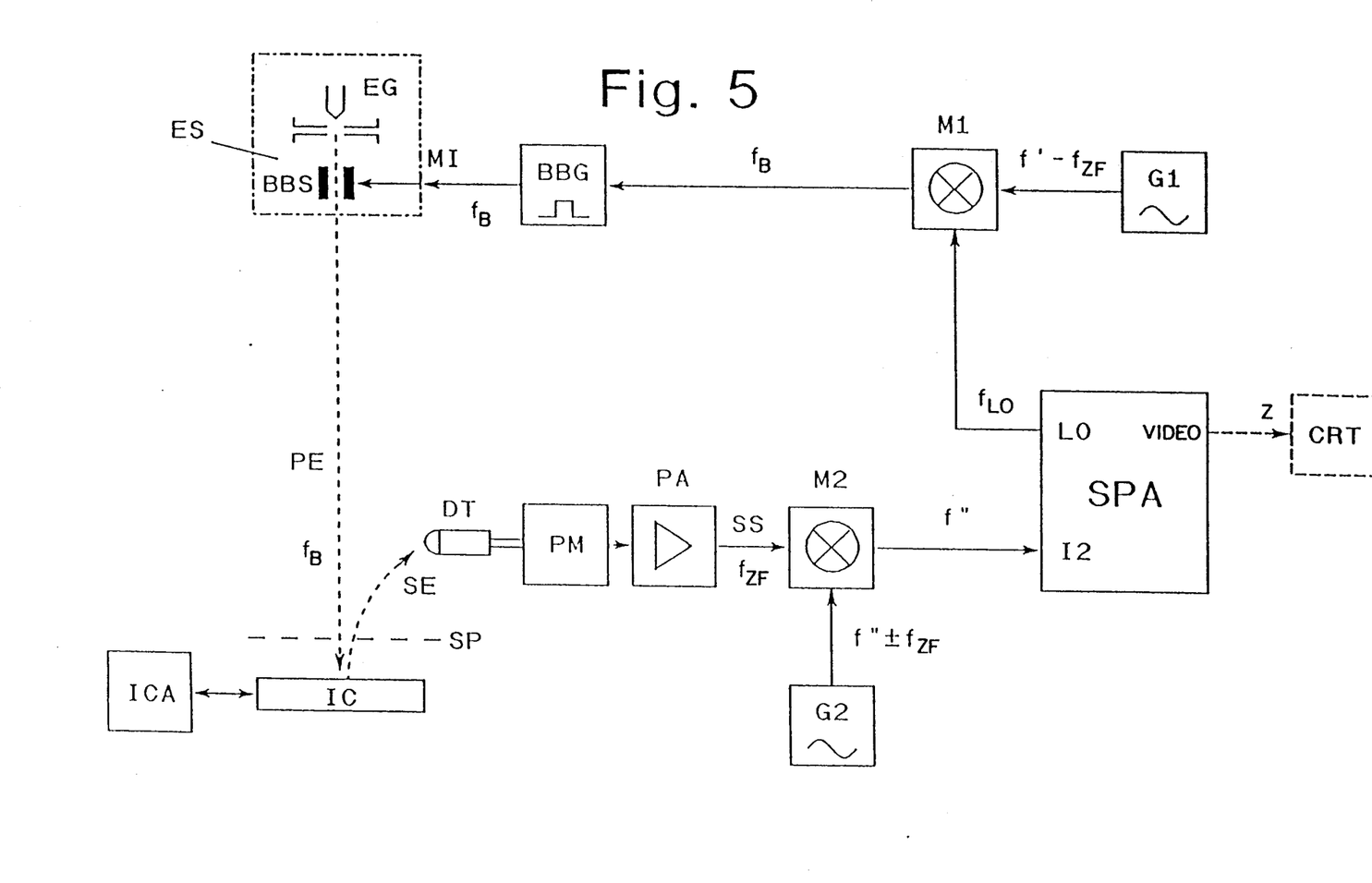
FIG. 5 depicts a modification of the system of FIG. 4 for measuring the spatial distribution of individual spectral lines.

FIG. 5 shows a modification of the invention, in which the spectral component of interest is transformed from the intermediate frequency range at $f_{ZF}$ into an internal intermediate frequency range of the spectrum analyzer SPA. It differs from th embodiment in FIG. 4 only in the wiring of the second frequency converter M2, if f' is the fixed internal intermediate frequency range, which is utilized as the input frequency range, the frequency $f''-f_{ZF}$ or the frequency $f''+f_{ZF}$ has to be transmitted to the second input of the second frequency converter M2. A second signal generator G2 supplies this frequency, the output of which is connected for this purpose to the second input of the second frequency converter M2. As an alternative, the frequency $f'-f_{ZF}$, and $f''+f_{ZF}$ is derived from the spectrum analyzer SPA by means of a PLL circuit. The output of the frequency converter is connected to the input I2 of the selected internal intermediate frequency range of the spectrum analyzer SPA. Contrary to the arrangement of FIG. 4, which can be used universally, this modified system presumes that an input of this kind exists, which unfortunately is not true of all commercial devices.

Figure 6A:
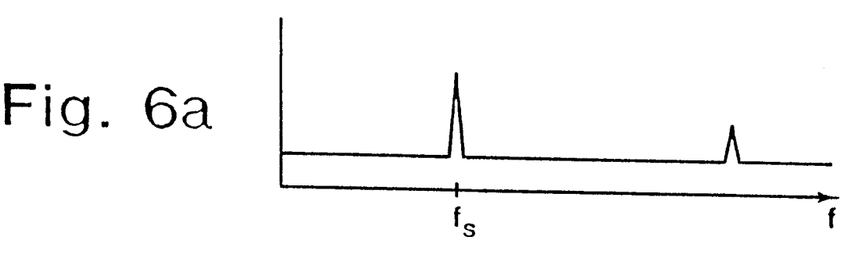
FIG. 6 an example of a measuring result such as can be obtained with the system of FIG. 4 or 5.
Figure 6B:
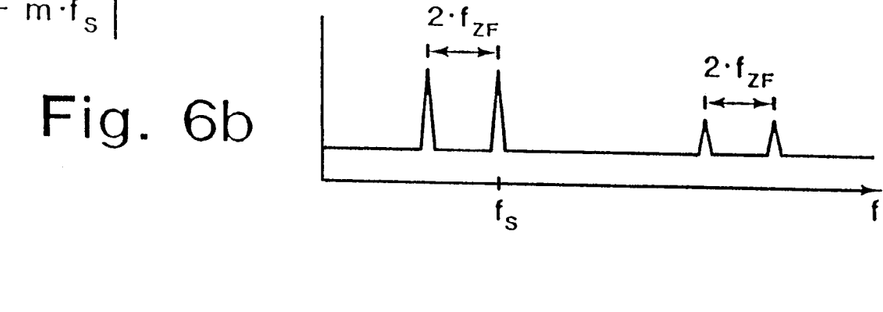

Regardless of which of the two described embodiments is utilized, in the process according to the invention, the actual evaluation of the spectrum analysis is carried out by the spectrum analyzer SPA. Operation also is as is customary in high-frequency measuring with the spectrum analyzer. The measured result appears on the screen of the spectrum analyzer SPA, not on the electron beam measuring device as in the prior art processes. The electron beam measuring device is actually used only for positioning the primary electron beam onto the measuring point, which simplifies operation even for the layman, as special training is not necessary. Only the interpretation of the obtained results differs slightly from the usual image. That is, due to the mixing condition (2) a double peak appears at the measuring point in the measured spectrum for each spectral component in signal u(t), whereby (in the scale of the spectrum analyzer) the upper peak corresponds to the actual frequency of the measured spectral component and the lower peak lies exactly $2+f_{ZF}$ below it, as illustrates in FIG. 6. In the top diagram a) a spectrum of the signal at the measuring point is illustrated; in the lower diagram b) the spectrum measured with the invented process consists of two pairs of peaks, characterizing the two spectral lines of the measuring signal.

Operating exclusively via the spectrum analyzer SPA also permits utilization of all extended operation types of a spectrum analyzer. Among these extended types of operation is, by way of illustration, automatic peak detection, tracking type of operation (in which the analyzer automatically tracks the frequency drift of a spectral line) and the monitoring type of operation (in which the analyzer measures and indicates the temporal change in the spectrum).

The first frequency conversion (with the aid of the first frequency converter M1) does not necessarily have to occur at the frequency $f - f_{UF}$; any frequency is possible as long as the second frequency conversion occurs in an input frequency range of the spectrum analyzer SPA (which, by way of illustration, is automatically the case in the embodiment according to FIG. 5). In that event, a frequency conversion can occur at a very high or also a very low frequency. In extreme cases, the frequency zero is even permissible; that is, the frequency conversion may be completely dispensed with. The generator G1 is, of course, superfluous in that case and the first frequency converter M1 may be a simple connecting piece.

Another embodiment of the invented process also permits easy measurement of the spatial distribution of a spectral component. For this purpose, the medium frequency of the spectrum analyzer SPA is set at the signal frequency of interest, the local distribution of which is to be determined, and the "zero-span" type of operation of the spectrum analyzer is selected. The spectrum analyzer SPA then measures the temporal change of this spectral line. Subsequently the demodulated output signal of the last step of the spectrum analyzer SPA (the signal which causes the y-modulation of the spectrum analyzer picture tube, usually called a video signal) is transmitted to the z-input (brilliance modulation) of the display CRT of the electron beam measuring device, if need be, following additional signal processing (e.g. level adjustment or a comparison with a threshold value in order to suppress undesired disturbances). This is shown with a broken line in FIGS. 4 and 5. If the primary electron beam PE (as in the conventional frequency tracing process) scans the sample IC synchronously with the writing beam which scans the screen CRT of the electron beam measuring device, the spatial distribution of the spectral lines of interest appears on the screen as brilliance distribution.

A further embodiment of the invented process yields a result like similar to conventional frequency mapping processes. As with the previous embodiments, the video output signal of the spectrum analyzer SPA is connected to the z-input of the screen CRT of the electron beam measuring device. However, the spectrum analyzer SPA is not operated in the "zero span" but rather in the conventional sweep type operation. As in frequency mapping processes, the primary electron beam PE is permitted to scan only along one line, and the writing beam of the screen CRT scans synchronously to it in one direction, by way of illustration, in the y-direction. The scanning of the writing beam in the perpendicular direction to it, that is, the x-direction, now has to occur synchronously to the sweep of the spectrum analyzer SPA. For this purpose, the sweep signal of the spectrum analyzer SPA (frequently called "sweepscan"), and thus the ramp-shaped signal indicating the just analyzed frequency, may be used in order to deflect the writing beam. Alternatively, in a reverse manner the x-deflection voltage of the screen CRT may be transmitted to the spectrum analyzer SPA as an external sweep signal.

Hitherto, the subject hereof has been a spectrum analyzer, which in this context is understood to mean a device which conducts a spectrum analysis, and in addition sweeps through the frequency range of interest. It should be noted in this regard that a so-called network analyzer also falls within this definition. A device of this kind measures not only the amplitude spectrum, as does a conventional spectrum analyzer, but also the phase spectrum. A network spectrum of this kind may therefore also be employed for the realization of the invented process.

According to another embodiment of the invention, an extension of the possible applications of a network analyzer is utilized, and the phase spectrum of signal u(t) is also measured at the measuring point. For this purpose, the sample triggering must be synchronized with the network analyzer, for example via a common reference frequency. Furthermore, the phase relationships of the participating signals must also be maintained in the frequency conversions, which can be ensured by using mixers as the frequency converters M1 and M2, and by making certain that the output signal of the first and, if need be, also the second signal generator G1 and G2 are synchronized with the network analyzer. This can be easily achieved by designing these generators as PLL circuits, which derive their output signal from a reference frequency of the spectrum analyzer. In this manner, the amplitude and phase spectrum of signal u(t) at the measuring point can be measured simultaneously. With these two items of information, the temporal course of the signal u(t) at the measuring point can be determined mathematically by a Fourier reverse retransformation in that time range.

There are, of course other possible embodiments of the electron source ES than the one shown in FIGS. 2-5. Thus, for example, instead of the heated cathode, which generates primary electrons PE by means of thermal emission, a field-emission cathode or a photocathode stimulated to emit electrons by laser pulses can be utilized. Also, a semiconductor cathode may be employed, in which case the intensity of the emission can very easily be controlled by varying the cathode current. An independent beam modulation system after the cathode can then be dispensed with, and the modulation signal MS controls the cathode current directly.

Naturally, other detectors can be used for deriving the secondary signal besides the secondary electron detector described in connection with FIGS. 2-5. For example scintillation counters, Faraday cages or semiconductor detectors may be used. A means for multiplying the secondary electrons (such as, for example, a channel plate) may, of course, always be connected before the detector itself. In principle, any detector which releases a measuring signal when secondary electrons impinge thereupon may be used. In particular, an energy spectrometer Sp can be used to derive the secondary signal SS. This is indicated by a counterfield network in the FIGS. 2-5. Especially well suited for this purpose is a counterfield spectrometer, such as disclosed, for example in U.S. Pat. No. 4,292,419, which can be utilized to obtain in a manner familiar to those versed in the art. A particularly easy possibility is, e.q., applying a constant voltage to the counterfield network.

The present invention is also not to be understood as limited to embodiment in which the primary beam PE is finely focused on the measuring point. Rather within the scope of the present invention the primary beam PE can also irradiate large areas of the sample, and the definition of the point of measurement occurs only through locally resolved gaining of the secondary signal SS. For example, the surface potential may be measured with photo-electrons by means of the potential contrasts by irradiating the sample with light over its entire surface (the primary beam PE is therefore substantially widened), registering the generated photo-electrons SE separately with the aid of a multi-channel detector according to their point of origin and transforming them into a secondary signal.

The mixing to the intermediate frequency $f_{ZF}$ is based on a non-linear relationship and the modulation of the primary electron beam. However, it can also be achieved by modulating the intensity of the secondary electrons or the secondary signal (SS) instead of the primary electrons, for example by modulating the energy threshold of an opposite-field spectrometer with the modulation frequency of fB. By taking into account the spectrometer characteristic, a sinusoidal modulation of the secondary electron signal can even be obtained, thereby avoiding possible difficulties with cross-modulation products, as they can sometimes occur in the described processes. However, the critical frequency is lower due to the higher capacities to be transferred and the energy dispersion of the secondary electrons. Moreover, the field of vision is limited by the spectrometer. Analogously, the photo-multiplier can also be operated together with a gate circuit or modulated in the video-signal path. In this event, the attainable bandwidth, however, is narrower.

The present invention has hitherto been described by using the potential contrast effect in an electron beam measuring device. Its use, however, is by no means restricted thereto. Any other particles, such as for example ions or any radiation, in particular light radiation can be utilized instead of primary and secondary electrons. Thus, a laser beam is used as the primary beam PE, it can cause the release of photo-electrons on the surface of the sample, which are then influenced by potential contrast of the electric fields on the surface of the sample, and can be detected, as previously described, as secondary electrons. The potential contrast can, however, also be replaced by other interactions, such as the influence of a magnetic field on the secondary electrons SE generated by a primary electron beam PE. Utilization of this so-called "magnetic contrast" permits examination of the movement of magnetic domains in magnet bubble memories. In addition, the secondary signal SS need not come from a secondary particle stream, which is registered with the aid of a detector. Just as, by way of illustration, the secondary signal may be derived directly from the sample e.q., by measuring the current induced by the primary beam PE in the sample IC. An example of such a technique is EBIC (electron beam induced current), which is well-known to those versed in the art.

Of course, the various modifications can be combined and employed in that manner. If a laser beam is used as the primary beam PE and an integrated circuit as the sample IC, the laser beam can generate electron-hole pairs in the pn-junction of the sample IC and thereby free charge carriers. This then becomes evident in the altered current input of the sample. The magnitude of this change also depends on the switching condition of the respective pn-junction. A change in the switching conditions of a pn-junction can be easily determined, therefore, by measuring the supply current of the sample IC. The supply current of the sample, and its deviation from the closed circuit current, can in this case serve directly as the second signal SS, and a special detector therefore is unnecessary. A laser beam can also be utilized as the primary beam in order to measure the surface potential of the sample IC. The interaction, which provides the multiplicative relationship, is in this case constituted by electro-optical effects. For this purpose, an electro-optical crystal is placed on the surface of the sample. In order to obtain the second signal, the primary beam PE can be aimed at the electro-optical crystal and the reflected light guided via a polarizer and transmitted to a detector, for example, a photo multiplier. If the electro-optical crystal rotates the polarization range of the light in response to the surface potential of the probe, the photomultipier delivers a signal at its output, having a level which depends on the surface potential of the sample, and therefore can be employed as the secondary signal.

What is claimed is:

1. A process for rapid spectrum analysis of a recurring signal at at least one measurement point on a sample and for measuring the spatial distribution of an individual spectral component of said signal on said sample, comprising the steps of:
    generating a primary beam which impinges on the sample and interacts therewith in a manner dependent on said recurring signal, to produce a stream of secondary radiation;
    deriving a secondary signal which is influenced by said interaction;
    performing a frequency conversion on an output from a local oscillator of a spectrum analyzer to derive a first modulation frequency;
    modulating said primary beam with said first modulation frequency, whereby said secondary signal contains an intermediate frequency which is a mixture of a frequency of said first modulation signal and a frequency of said spectral component; and
    transforming a signal component of said secondary signal at said intermediate frequency into an input frequency range of said spectrum analyzer by means of a second frequency conversion.

2. A process according to claim 1, wherein said input frequency range of said spectrum analyzer is an input selection range thereof.

3. A process according to claim 1, wherein said input frequency range of said spectrum analyzer is an internal intermediate frequency range of said spectrum analyzer.

4. A process according to claim 1, wherein said spectrum analyzer is operated in a sweeping operation.

5. A process according to claim 2, wherein said spectrum analyzer is operated in a sweeping operation.

6. A process according to claim 3, wherein said spectrum analyzer is operated in a sweeping operation.

7. A process according to claim 1, wherein, said spectrum analyzer is operated in a "zero span" mode, the output signal of said spectrum analyzer is transmitted to a recording means, at least one signal carrying spatial information about the respective measuring point is transmitted to said recording means, and said primary beam is positioned successively at different measuring points.

8. A process according to claim 1, wherein said interaction between said primary beam and said sample comprises the generation of secondary electrons by said primary beam and the subsequent influence of the potential contrast on said secondary electrons.

9. A process according to claim 7, wherein said interaction between said primary beam and said sample comprises the generation of secondary electrons by said primary beam and the subsequent influence of the potential contrast on said secondary electrons.

10. Apparatus for rapid spectrum analysis of a recurring signal at at least one point of measuring on a sample and for measuring the spatial distribution of an individual spectral component of said signal on said sample, comprising:
 a primary beam source for generating a primary beam;
 a device for guiding and focussing said primary beam onto said sample, which device is supplied with supply voltages and triggering signals by a triggering means;
 a device for deriving a secondary signal from said sample, with said secondary signal being influenced by an interaction between said primary beam and the sample;
 a device for modulating said primary beam with a modulation frequency;
 a spectrum analyzer;
 a first frequency converter, a first input of which is connected to a local oscillator output of said spectrum analyzer, and an output thereof is connected to said device for modulation;
 a second frequency converter, the first input of which is connected to said device deriving said secondary signal, and an output thereof is connected to an input of said spectrum analyzer.

11. Apparatus according to claim 10, wherein said primary beam source comprises an electron gun for generating an unmodulated stream of primary particles and a beam modulation system connected thereto as a device for modulation.

12. Apparatus according to claim 10, wherein a beam modulation generator transmits a modulation signal as an input to said device for modulating, with an input of said beam modulation generator being connected to the output of said first frequency converter.

13. Apparatus according to claim 11, wherein a beam modulation generator transmits a modulation signal as an input to said device for modulating, with an input of said beam modulation generator being connected to the output of said first frequency converter.

14. Apparatus according to claim 10, wherein an output frequency of said first frequency converter deviates from an absolute magnitude of a difference between a frequency of the local oscillator output and a frequency of a first internal intermediate frequency of said spectrum analyzer by a constant frequency value, with said constant value being within a frequency range that can be detected by said device for deriving said secondary signal.

15. Apparatus according to claim 11, wherein an output frequency of said first frequency converter deviates from an absolute magnitude of a difference between a frequency of the local oscillator output and a frequency of a first internal intermediate frequency of said spectrum analyzer by a constant frequency value, with said constant value being within a frequency range that can be detected by said device for deriving said secondary signal.

16. Apparatus according to claim 10, wherein an output of said second frequency converter is connected to a selection input of said spectrum analyzer, and said second frequency converter decreases a frequency thereof by the value of said modulation frequency.

17. Apparatus according to claim 11, wherein an output of said second frequency converter is connected to a selection input of said spectrum analyzer, and said second frequency converter decreases a frequency thereof by the value of said modulation frequency.

18. Apparatus according to claim 14, wherein said output of said second frequency converter is connected to an input to an internal intermediate frequency stage of said spectrum analyzer (SPA) and said second frequency converter decreases a frequency thereof by an absolute magnitude of a difference or sum of an intermediate frequency of said internal intermediate frequency stage and said constant frequency value.

19. Apparatus according to claim 10, wherein an output of said spectrum analyzer is connected to an input of a recording means, with at last a further signal carrying information about the site of the respective measuring point being transmitted to said recording means.

20. Apparatus according to claim 19, wherein said recording means is a screen and said spectrum analyzer is swept synchronously with the deflection of the writing beam of said recording means.

* * * * *